United States Patent
Yokoyama et al.

(10) Patent No.: US 11,935,971 B2
(45) Date of Patent: Mar. 19, 2024

(54) SOLAR CELL

(71) Applicant: Panasonic Intellectual Property Management Co., Ltd., Osaka (JP)

(72) Inventors: Tomoyasu Yokoyama, Osaka (JP); Ryosuke Kikuchi, Osaka (JP); Yu Nishitani, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/821,818

(22) Filed: Aug. 24, 2022

(65) Prior Publication Data
US 2022/0416099 A1 Dec. 29, 2022

Related U.S. Application Data

(63) Continuation of application No. PCT/JP2020/049230, filed on Dec. 28, 2020.

(30) Foreign Application Priority Data

Mar. 12, 2020 (JP) ................... 2020-043540

(51) Int. Cl.
*H01L 31/0224* (2006.01)
*H01L 31/0264* (2006.01)

(52) U.S. Cl.
CPC .. *H01L 31/022425* (2013.01); *H01L 31/0264* (2013.01)

(58) Field of Classification Search
CPC ........ H01L 31/022425; H01L 31/0264; H10K 30/50; H10K 30/80; H10K 85/50
See application file for complete search history.

(56) References Cited

U.S. PATENT DOCUMENTS

| | | | | |
|---|---|---|---|---|
| 2007/0108898 A1* | 5/2007 | Matsuura | ............... | H10K 50/14 313/506 |
| 2015/0295194 A1* | 10/2015 | Kanatzidis | ............. | H10K 85/00 136/263 |
| 2017/0263686 A1* | 9/2017 | Beiley | ............... | H01L 27/14601 |

FOREIGN PATENT DOCUMENTS

| | | |
|---|---|---|
| CN | 107331775 | 11/2017 |
| CN | 107369766 A | 11/2017 |

(Continued)

OTHER PUBLICATIONS

International Search Report of PCT application No. PCT/JP2020/049230 dated Mar. 16, 2021.

(Continued)

*Primary Examiner* — Golam Mowla
(74) *Attorney, Agent, or Firm* — GREENBLUM & BERNSTEIN, P.L.C.

(57) ABSTRACT

A solar cell according to the present disclosure includes a first electrode, a second electrode, a photoelectric conversion layer disposed between the first electrode and the second electrode, and an electron transport layer disposed between the first electrode and the photoelectric conversion layer. At least one electrode selected from the group consisting of the first electrode and the second electrode has a light-transmitting property. The photoelectric conversion layer contains a perovskite compound composed of a monovalent cation, a divalent cation, and a halogen anion. The electron transport layer contains a metal oxynitride having electron conductivity. The metal oxynitride has an electrical conductivity of greater than or equal to $1 \times 10^{-7}$ S/cm.

7 Claims, 3 Drawing Sheets

(56) References Cited

FOREIGN PATENT DOCUMENTS

| JP | 2005-064493 | 3/2005 |
|----|-------------|--------|
| JP | 2017-017252 | 1/2017 |
| JP | 2018-157147 | 10/2018 |
| JP | 2019-039048 | 3/2019 |

OTHER PUBLICATIONS

Atsushi Kogo et al., "Nb2O5 Blocking Layer for High Open-circuit Voltage Perovskite Solar Cells", Chem. Lett., 2015, vol. 44, pp. 829-830.
Shuyan Shao et al., "Highly Reproducible Sn-Based Hybrid Perovskite Solar Cells with 9% Efficiency", Advanced Energy Materials, 2018, vol. 8, 1702019.
Office Action issued in EP Patent Application No. 20924854.1., dated Jul. 17, 2023.
Xufeng Ling et al.: "Room-Temperature Processed $Nb_2O_5$ as the Electron-Transporting Layer for Efficient Planar Perovskite Solar Cells", Applied Materials & Interfaces, vol. 9, No. 27, Jun. 29, 2017 (Jun. 29, 2017), pp. 23181-23188, XP055709956.

* cited by examiner

SOLAR CELL

BACKGROUND

1. Technical Field

The present invention relates to a solar cell.

2. Description of the Related Art

In recent years, perovskite solar cells have been researched and developed. Regarding perovskite solar cells, perovskite compounds denoted by a chemical formula $ABX_3$ (herein, A represents a monovalent cation, B represents a divalent cation, and X represents a halogen anion) are used as photoelectric conversion materials.

Shuyan Shao et. Al. "Highly Reproducible Sn-based Hybrid Perovskite Solar Cells with 9% Efficiency", Advanced Energy Materials, 2018, Vol. 8, 1702019 and Japanese Unexamined Patent Application Publication No. 2017-17252 disclose that a perovskite compound denoted by a chemical formula $CH_3NH_3SnI_3$ (hereafter referred to as "MASnI$_3$") is used as a photoelectric conversion material of a perovskite solar cell. Shuyan Shao et. Al. "Highly Reproducible Sn-based Hybrid Perovskite Solar Cells with 9% Efficiency", Advanced Energy Materials, 2018, Vol. 8, 1702019 and Japanese Unexamined Patent Application Publication No. 2017-17252 also disclose a perovskite compound denoted by a chemical formula $(NH_2)_2CHSnI_3$ (hereafter referred to as "FASnI$_3$"). In addition, Japanese Unexamined Patent Application Publication No. 2017-17252 also discloses perovskite compounds denoted by a chemical formula $CH_3NH_3PbI_3$ (hereafter referred to as "MAPbI$_3$") and a chemical formula $(NH_2)_2CHPbI_3$ (hereafter referred to as "FAPbI$_3$"), in which the divalent cation is Pb, as photoelectric conversion materials (see, for example, Atsushi Kogo et al., "Nb2O5 Blocking Layer for High Open-circuit Voltage Perovskite Solar Cells", Chem. Lett., 2015, Vol. 44, 829-830).

SUMMARY

One non-limiting and exemplary embodiment provides a perovskite solar cell having a high photoelectric conversion efficiency.

In one general aspect, the techniques disclosed here feature a solar cell including a first electrode, a second electrode, a photoelectric conversion layer disposed between the first electrode and the second electrode, and an electron transport layer disposed between the first electrode and the photoelectric conversion layer, wherein at least one electrode selected from the group consisting of the first electrode and the second electrode has a light-transmitting property, the photoelectric conversion layer contains a perovskite compound composed of a monovalent cation, a divalent cation, and a halogen anion, the electron transport layer contains a metal oxynitride having electron conductivity, and the metal oxynitride has an electrical conductivity of greater than or equal to $1 \times 10^{-7}$ S/cm.

The present disclosure provides a perovskite solar cell having a high photoelectric conversion efficiency.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Definition of Term

A term "perovskite compound" used in the present specification means a perovskite crystal structure denoted by a chemical formula $ABX_3$ (herein, A represents a monovalent cation, B represents a divalent cation, and X represents a halogen anion) and a structure having a crystal similar to the perovskite crystal.

A term "perovskite solar cell" used in the present specification means a solar cell containing a perovskite compound as a photoelectric conversion material.

A term "tin-based perovskite compound" used in the present specification means a perovskite compound containing tin.

Underlying Knowledge Forming Basis of the Present Disclosure

Underlying knowledge forming basis of the present disclosure is as described below.

The perovskite compound has a band gap of about 1.1 to 1.6 eV. Therefore, the perovskite compound is suitable for a photoelectric conversion material of a solar cell. A perovskite solar cell is reported to have a high photoelectric conversion efficiency, and it is desirable that the photoelectric conversion efficiency is further improved.

Figure 1:
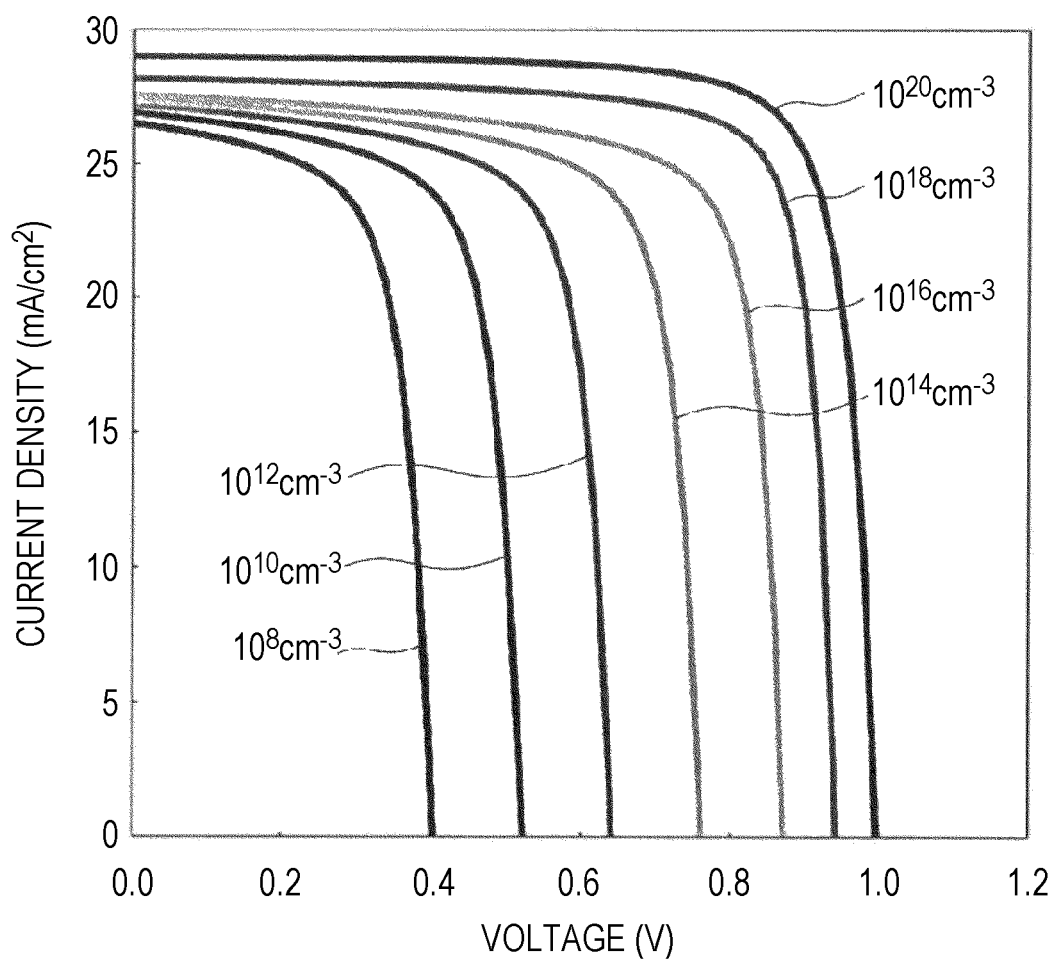
FIG. 1 is a diagram illustrating simulation results when the electron density of an electron transport layer is $1 \times 10^8$ cm$^{-3}$, $1 \times 10^{10}$ cm$^{-3}$, $1 \times 10^{12}$ cm$^{-3}$, $1 \times 10^{14}$ cm$^{-3}$, $1 \times 10^{16}$ cm$^{-3}$, $1 \times 10^{18}$ cm$^{-3}$, or $1 \times 10^{20}$ cm$^{-3}$.

To improve the photoelectric conversion efficiency, it is necessary to increase the electron density of an electron transport layer than ever before. FIG. 1 is a graph illustrating the relationship between the voltage (horizontal axis) of a solar cell and the current density (vertical axis) of the solar cell with respect to each electron density of an electron transport layer. The graph indicates the results calculated through a device simulation (software name: SCAPS). FIG. 1 illustrates simulation results when the electron density of an electron transport layer is $1 \times 10^8$ cm$^{-3}$, $1 \times 10^{10}$ cm$^{-3}$, $1 \times 10^{12}$ cm$^{-3}$, $1 \times 10^{14}$ cm$^{-3}$, $1 \times 10^{16}$ cm$^{-3}$, $1 \times 10^{18}$ cm$^{-3}$, and $1 \times 10^{20}$ cm$^{-3}$. As illustrated clearly in FIG. 1, the open voltage increases with increasing the electron density of the electron transport layer. The built-in potential applied to a perovskite layer increases and the open voltage increases with increasing the electron density of the electron transport layer. Consequently, it can be expected that an increase in the electron density of the electron transport layer increases the open voltage and the photoelectric conversion efficiency of the perovskite solar cell. To obtain a high efficiency (for example, a current density of greater than or equal to 27 mA/cm$^2$ at a voltage of 0.8 V), it is necessary that the electron density of the electron transport layer be greater than or equal to $1 \times 10^{16}$ cm$^{-3}$. The electron density of the electron transport layer composed of an oxide-based electron transport material such as TiO$_2$ or Nb$_2$O$_5$ reported in the related art is less than or equal to $1\times10^{15}$ cm$^{-3}$. Therefore, a new electron transport material having a high electron density is required.

An oxynitride has a higher electron density than an oxide used as an electron transport material in the related art. In general, an oxide serving as an n-type semiconductor realizes electron transport characteristics due to an oxygen site becoming a vacancy and the resulting defective species serving as a donor. On the other hand, regarding the oxynitride, a nitrogen site readily becomes a vacancy in air and the nitrogen site is readily substituted with an oxygen ion. Since such two types of donor-like defective species are readily generated compared with an oxygen vacancy in an oxide and supply a large amount of electrons, the oxynitride has a higher electron density than the oxide.

On the basis of such findings, the present inventors provide a solar cell that contains a perovskite compound and that includes an electron transport layer having a high electron density.

Embodiment According to the Present Disclosure

The embodiment according to the present disclosure will be described below in detail with reference to the drawings.

Figure 2:
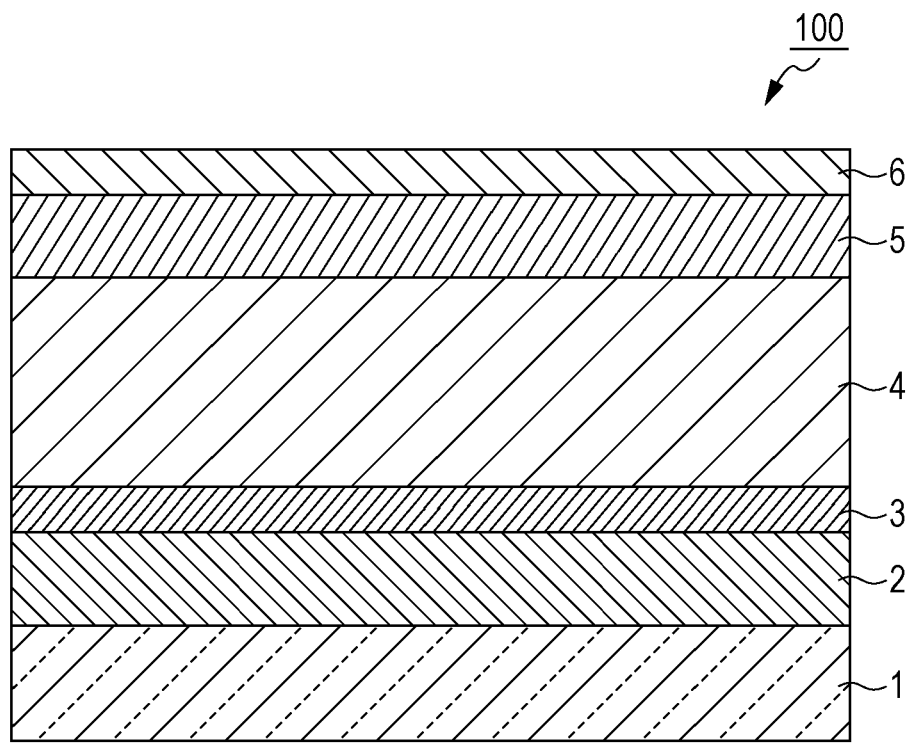
FIG. 2 is a sectional view illustrating a solar cell according to an embodiment of the present disclosure.

FIG. 2 is a sectional view illustrates a solar cell 100 according to the present embodiment. As illustrated in FIG. 2, the solar cell 100 according to the present embodiment includes a first electrode 2, a second electrode 6, a photoelectric conversion layer 4 disposed between the first electrode 2 and the second electrode 6, and an electron transport layer 3 disposed between the first electrode 2 and the photoelectric conversion layer 4.

The first electrode 2 opposes the second electrode 6 so that the electron transport layer 3 and the photoelectric conversion layer 4 are located between the first electrode 2 and the second electrode 6. At least one electrode selected from the group consisting of the first electrode 2 and the second electrode 6 has a light-transmitting property. In the present specification, a sentence "an electrode has a light-transmitting property" means that regarding the light with an wavelength of 200 to 2,000 nanometers, greater than or equal to 10% of the light with some wavelength passes through an electrode.

Photoelectric Conversion Layer 4

The photoelectric conversion layer 4 contains a perovskite compound composed of a monovalent cation, a divalent cation, and a halogen anion as a photoelectric conversion material. The photoelectric conversion material is a light-absorbing material.

In the present embodiment, a perovskite compound may be a compound denoted by a chemical formula $ABX_3$ (herein, A represents a monovalent cation, B represents a divalent cation, and X represents a halogen anion).

In the present specification, A, B, and X are also referred to as an A site, a B site, and an X site, respectively, in accordance with an expression idiomatically used for the perovskite compound.

In the present embodiment, the perovskite compound may have a perovskite type crystal structure denoted by the chemical formula $ABX_3$. As an example, a monovalent cation is located at the A site, a divalent cation is located at the B site, and a halogen anion is located at the X site.

Each of the A site, the B site, and the X site may be occupied by a plurality of types of ions.

A Site

There is no particular limitation regarding the monovalent cation located at the A site. An example of the monovalent cation is an organic cation or an alkali metal cation. An example of the organic cation is a methylammonium cation (that is, $CH_3NH_3^+$), a formamidinium cation (that is, $NH_2CHNH_2^+$), a phenylethylammonium cation (that is, $C_6H_5C_2H_4NH_3^+$), or a guanidium cation, (that is, $CH_6N_3^+$). An example of the alkali metal cation is a cesium cation (that is, $Cs^+$).

For the sake of a high photoelectric conversion efficiency, it is desirable that the monovalent cation A includes a formamidinium cation.

The monovalent cation located at the A site may be composed of at least two types of cations.

The A site may mainly include the formamidinium cation. The sentence "the A site mainly includes the formamidinium cation" means that the proportion of the amount of moles of formamidinium cations is the greatest in a total amount of moles of monovalent cations.

The A site may consist essentially of just the formamidinium cation. The sentence "the A site consists essentially of just the formamidinium cation" means that the molar ratio of moles of formamidinium cations to a total amount of moles of monovalent cations is greater than or equal to 90% and desirably greater than or equal to 95%.

B Site

There is no particular limitation regarding the divalent cation located at the B site. An example of the divalent cation is a metal cation. An example of the metal cation is a lead ion ($Pb^{2+}$), a tin ion ($Sn^{2+}$), a germanium ion ($Ge^{2+}$), a zinc ion ($Zn^{2+}$), a cadmium ion ($Cd^{2+}$), a beryllium ion ($Be^{2+}$), a magnesium ion ($Mg^{2+}$), a calcium ion ($Ca^{2+}$), a strontium ion ($Sr^{2+}$), a barium ion ($Ba^{2+}$), a titanium ion ($Ti^{2+}$), a vanadium ion ($V^{2+}$), a chromium ion ($Cr^{2+}$), a manganese ion ($Mn^{2+}$), an iron ion ($Fe^{2+}$), a cobalt ion ($Co^{2+}$), a nickel ion ($Ni^{2+}$), a copper ion ($Cu^{2+}$), a palladium ion ($Pd^{2+}$), a platinum ion ($Pt^{2+}$), a neodymium ion ($Nd^{2+}$), a samarium ion ($Sm^{2+}$), a europium ion ($Eu^{2+}$), a dysprosium ion ($Dy^{2+}$), a thulium ion ($Tm^{2+}$), an ytterbium ion ($Yb^{2+}$), or a neptunium ion ($Np^{2+}$).

For the sake of a high photoelectric conversion efficiency, it is desirable that the divalent cation include at least one selected from the group consisting of a tin ion ($Sn^{2+}$) and a lead ion ($Pb^{2+}$).

The divalent cation located at the B site may be composed of at least two types of cations.

The divalent cation located at the B site may be composed of at least two types of cations other than divalent cations and may be treated as an average of divalent cation. For example, when a monovalent cation and a trivalent cation occupy the B site with equal probability, it is assumed that a divalent cation is located at the B site on the average of the entire system. An example of such a monovalent cation is a lithium ion ($Li^+$), a sodium ion ($Na^+$), a potassium ion ($K^+$), a rubidium ion ($Rb^+$), a cesium ion ($Cs^+$), a copper ion ($Cu^+$), a silver ion ($Ab^+$), a gold ion ($Au^+$), a mercury ion ($Hg^+$), an indium ion ($In^+$), or a thallium ion ($Tl^+$). An example of the trivalent cation is a scandium ion ($Sc^{3+}$), an yttrium ion ($Y^{3+}$), a lanthanum ion ($La^{3+}$), a cerium ion ($Ce^{3+}$), a praseodymium ion ($Pr^{3+}$), a neodymium ion ($Nd^{3+}$), a promethium ion ($Pm^{3+}$), a samarium ion ($Sm^{3+}$), a europium ion ($Eu^{3+}$), a gadolinium ion ($Gd^{3+}$), a terbium ion ($Tb^{3+}$), a dysprosium ion ($Dy^{3+}$), a holmium ion ($Ho^{3+}$), an erbium ion ($Er^{3+}$), a thulium ion ($Tm^{3+}$), an ytterbium ion ($Yb^{3+}$), a lutetium ion ($Lu^{3+}$), a titanium ion ($Ti^{3+}$), a vanadium ion ($V^{3+}$), a chromium ion ($Cr^{3+}$), a manganese ion ($Mn^{3+}$), a boron ion ($B^{3+}$), an aluminum ion ($Al^{3+}$), an iron ion ($Fe^{3+}$), a cobalt ion ($Co^{3+}$), a nickel ion ($Ni^{3+}$), a copper ion ($Cu^{3+}$), a niobium ion ($Nb^{3+}$), a molybdenum ion ($Mo^{3+}$), a ruthenium ion ($Ru^{3+}$), a rhodium ion ($Rh^{3+}$), a palladium ion ($Pd^{3+}$), a silver ion ($Ag^{3+}$), a tantalum ion ($Ta^{3+}$), an iridium ion ($Ir^{3+}$), a gold ion ($Au^{3+}$), a gallium ion ($Ga^{3+}$), an indium ion ($In^{3+}$), a thallium ion ($Tl^{3+}$), a phosphorus ion ($P^{3+}$), an arsenic ion ($As^{3+}$), an antimony ion ($Sb^{3+}$), or a bismuth ion ($Bi^{3+}$).

X Site

For the sake of a high photoelectric conversion efficiency, it is desirable that the halogen anion located at the X site include, for example, an iodide ion. The halogen anion located at the X site may be composed of at least two types of halogen ions.

The X site may mainly include an iodide ion. The sentence "the X site mainly includes an iodide ion" means that the proportion of the amount of moles of iodide ions is the greatest in a total amount of moles of halogen anions. The X site may consist essentially of just the iodide ion. The sentence "the X site consists essentially of just the iodide ion" means that the molar ratio of moles of iodide ions to a total amount of moles of halogen anions is greater than or equal to 90% and desirably greater than or equal to 95%.

The photoelectric conversion layer 4 may contain materials other than photoelectric conversion materials. For example, the photoelectric conversion layer 4 may further contain a quencher substance for reducing the defect density of the perovskite compound. The quencher substance is a fluorine compound such as tin fluoride. The molar ratio of the quencher substance to the photoelectric conversion material may be greater than or equal to 5% and less than or equal to 20%.

The photoelectric conversion layer 4 may mainly contain a perovskite compound composed of a monovalent cation, a divalent cation, and a halogen anion.

The sentence "the photoelectric conversion layer 4 mainly contains a perovskite compound composed of a monovalent cation, a divalent cation, and a halogen anion" means that the photoelectric conversion layer 4 contains greater than or equal to 70% (desirably greater than or equal to 80%) of the perovskite compound composed of a monovalent cation, a divalent cation, and a halogen anion.

The photoelectric conversion layer 4 may contain impurities. The photoelectric conversion layer 4 may further contain compounds other than the above-described perovskite compound.

The photoelectric conversion layer 4 may have a thickness of greater than or equal to 100 nanometers and less than or equal to 10 micrometers and, desirably, a thickness of greater than or equal to 100 nanometers and less than or equal to 1,000 nanometers. The thickness of the photoelectric conversion layer 4 is set in accordance with the magnitude of light absorption thereof.

The photoelectric conversion layer 4 can be formed using a solution-coating method or the like.

Electron Transport Layer 3

The electron transport layer 3 contains a metal oxynitride having electron conductivity as an electron transport material. The electron density of the metal oxynitride is higher than the electron density of a metal oxide. Therefore, when a metal oxynitride having electron conductivity and a metal oxide having electron conductivity are compared with each other, the metal oxynitride is superior from the viewpoint of electron transportability. In this regard, the metal oxynitride having electron conductivity means a metal oxynitride having an electrical conductivity of greater than or equal to $1\times10^{-7}$ S $cm^{-1}$. The metal oxynitride contained in the electron transport layer 3 desirably has an electrical conductivity of greater than or equal to $1\times10^{-6}$ S $cm^{-1}$ and further desirably has an electrical conductivity of greater than or equal to $1\times10^{-5}$ S·$cm^{-1}$. For example, the electrical conductivities of $TiO_2$, $SnO_2$, and $Nb_2O_5$, which are reported as electron transport materials, are 0.01 S·$cm^{-1}$, 0.01 S·$cm^{-1}$, and $1\times10^{-5}$ S·$cm^{-1}$, respectively. On the other hand, the electrical conductivity of $Ta_2O_5$ which is not reported as an electron transport material is $1\times10^{-8}$ S·$cm^{-1}$.

As demonstrated in Comparative example 3 and Comparative example 4 described later, a solar cell including the electron transport layer 3 formed from a metal oxynitride (for example, a tantalum oxynitride according to Comparative example 4) produced by adding nitrogen to a metal oxide having poor electron conductivity (for example, a tantalum oxide according to Comparative example 3) has a significantly low photoelectric conversion efficiency (for example, 0%). In other words, a metal oxynitride obtained by adding nitrogen to a metal oxide having poor electron conductivity (for example, having an electrical conductivity of less than or equal to $1\times10^{-8}$ S·$cm^{-1}$) has poor electron conductivity in a manner similar to a metal oxide. Therefore, the solar cell including an electron transport layer formed from such a metal oxynitride does not function as a solar cell.

The metal oxynitride is produced by adding nitrogen to the metal oxide having electron conductivity. The thus produced metal oxynitride has a high electron density. A perovskite solar cell including the electron transport layer 3 containing the oxynitride having a high electron density can be expected to have a high open voltage and a high photoelectric conversion efficiency. That is, the solar cell according to the present embodiment can realize a high photoelectric conversion efficiency.

An example of the metal oxide having electron conductivity is $Nb_2O_5$, $SnO_2$, $TiO_2$, $ZnO$, $In_2O_3$, $WO_3$, $Fe_2O_3$, $CeO_2$, $SrTiO_3$, $Zn_2SnO_4$, or $BaSnO_3$. Therefore, in the solar cell according to the present embodiment, an example of the metal oxynitride contained as the electron transport material in the electron transport layer 3 is (i) a niobium oxynitride produced by adding nitrogen to $Nb_2O_5$
(ii) a titanium oxynitride produced by adding nitrogen to $SnO_2$
(iii) a titanium oxynitride produced by adding nitrogen to $TiO_2$
(iv) a zinc oxynitride produced by adding nitrogen to ZnO
(v) an indium oxynitride produced by adding nitrogen to $In_2O_3$
(vi) a tungsten oxynitride produced by adding nitrogen to $WO_3$
(vii) an ion oxynitride produced by adding nitrogen to $Fe_2O_3$
(viii) a cesium oxynitride produced by adding nitrogen to $CeO_2$
(ix) a nitrided strontium titanate produced by adding nitrogen to $SrTiO_3$
(x) a nitrided zinc tin oxide produced by adding nitrogen to $Zn_2SnO_4$, or
(xi) a nitrided barium tin oxide produced by adding nitrogen to $BaSnO_3$.

That is, the metal oxynitride contained in the electron transport layer may be at least one selected from the group consisting of a niobium oxynitride, a tin oxynitride, a zinc oxynitride, an indium oxynitride, a tungsten oxynitride, an iron oxynitride, a cesium oxynitride, a nitrided strontium titanate, a nitrided zinc tin oxide, and a nitrided barium tin oxide. For the sake of a higher photoelectric conversion efficiency, the metal oxynitride contained in the electron transport layer may be at least one selected from the group consisting of a niobium oxynitride and a tin oxynitride.

The perovskite type oxide $ABO_3$ has also electron conductivity. An example of the perovskite type oxide having electron conductivity is
  (i) an oxide in which a divalent cation is located at the A site and in which a tetravalent cation is located at the B site
  (ii) an oxide in which a trivalent cation is located at the A site and in which a trivalent cation is located at the B site, or
  (iii) an oxide in which a tetravalent cation is located at the A site and in which a divalent cation is located at the B site.
An example of the perovskite type oxide is $SrTiO_3$.

The spinel type oxide $A_2BO_4$ has also electroconductive electron transport characteristics. An example of the spinel type oxide having electron conductivity is
  (i) an oxide in which a divalent cation is located at the A site and in which a tetravalent cation is located at the B site, or
  (ii) an oxide in which a trivalent cation is located at the A site and in which a divalent cation is located at the B site.
An example of the spinel type oxide is $Zn_2SnO_4$.

In this regard, in the above-described perovskite type oxides and spinel type oxides, the divalent cation is a lead ion ($Pb^{2+}$), a tin ion ($Sn^{2+}$), a germanium ion ($Ge^{2+}$), a zinc ion ($Zn^{2+}$), a cadmium ion ($Cd^{2+}$), a beryllium ion ($Be^{2+}$), a magnesium ion ($Mg^{2+}$), a calcium ion ($Ca^{2+}$), a strontium ion ($Sr^{2+}$), a barium ion ($Ba^{2+}$), a titanium ion ($Ti^{2+}$), a vanadium ion ($V^{2+}$), a chromium ion ($Cr^{2+}$), a manganese ion ($Mn^{2+}$), an iron ion ($Fe^{2+}$), a cobalt ion ($Co^{2+}$), a nickel ion ($Ni^{2+}$), a copper ion ($Cu^{2+}$), a palladium ion ($Pd^{2+}$), a platinum ion ($Pt^{2+}$), a neodymium ion ($Nd^{2+}$), a samarium ion ($Sm^{2+}$), a europium ion ($Eu^{2+}$), a dysprosium ion ($Dy^{2+}$), a thulium ion ($Tm^{2+}$), an ytterbium ion ($Yb^{2+}$), or a neptunium ion ($Np^{2+}$).

In the above-described perovskite type oxides and spinel type oxides, the trivalent cation is a scandium ion ($Sc^{3+}$), an yttrium ion ($Y^{3+}$), a lanthanum ion ($La^{3+}$), a cerium ion ($Ce^{3+}$), a praseodymium ion ($Pr^{3+}$), a neodymium ion ($Nd^{3+}$), a promethium ion ($Pm^{3+}$), a samarium ion ($Sm^{3+}$), an europium ion ($Eu^{3+}$), a gadolinium ion ($Gd^{3+}$), a terbium ion ($Tb^{3+}$), a dysprosium ion ($Dy^{3+}$), a holmium ion ($Ho^{3+}$), an erbium ion ($Er^{3+}$), a thulium ion ($Tm^{3+}$), an ytterbium ion ($Yb^{3+}$), a lutetium ion ($Lu^{3+}$), a titanium ion ($Ti^{3+}$), a vanadium ion ($V^{3+}$), a chromium ion ($Cr^{3+}$), a manganese ion ($Mn^{3+}$), a boron ion ($B^{3+}$), an aluminum ion ($Al^{3+}$), an iron ion ($Fe^{3+}$), a cobalt ion ($Co^{3+}$), a nickel ion ($Ni^{3+}$), a copper ion ($Cu^{3+}$), a niobium ion ($Nb^{3+}$), a molybdenum ion ($Mo^{3+}$), a ruthenium ion ($Ru^{3+}$), a rhodium ion ($Rh^{3+}$), a palladium ion ($Pd^{3+}$), a silver ion ($Ag^{3+}$), a tantalum ion ($Ta^{3+}$), an iridium ion ($Ir^{3+}$), a gold ion ($Au^{3+}$), a gallium ion ($Ga^{3+}$), an indium ion ($In^{3+}$), a thallium ion ($Tl^{3+}$), a phosphorus ion ($P^{3+}$), an arsenic ion ($As^{3+}$), an antimony ion ($Sb^{3+}$), or a bismuth ion ($Bi^{3+}$).

In the above-described perovskite type oxides and spinel type oxides, the tetravalent cation is a carbon ion ($C^{4+}$), a silicon ion ($Si^{4+}$), a sulfur ion ($S^{4+}$), a titanium ion ($Ti^{4+}$), a vanadium ion ($V^{4+}$), a chromium ion ($Cr^{4+}$), a manganese ion ($Mn^{4+}$), an iron ion ($Fe^{4+}$), a cobalt ion ($Co^{4+}$), a nickel ion ($Ni^{4+}$), a germanium ion ($Ge^{4+}$), a selenium ion ($Se^{4+}$), a zirconium ion ($Zr^{4+}$), a niobium ion ($Nb^{4+}$), a molybdenum ion ($Mo^{4+}$), a technetium ion ($Tc^{4+}$), a ruthenium ion ($Ru^{4+}$), a rhodium ion ($Rh^{4+}$), a palladium ion ($Pd^{4+}$), a tin ion ($Sn^{4+}$), a tellurium ion ($Te^{4+}$), a hafnium ion ($Hf^{4+}$), a tantalum ion ($Ta^{4+}$), a tungsten ion ($W^{4+}$), a rhenium ion ($Re^{4+}$), an osmium ion ($Os^{4+}$), an iridium ion ($Ir^{4+}$), a platinum ion ($Pt^{4+}$), a lead ion ($Pb^{4+}$), a polonium ion ($Po^{4+}$), a cerium ion ($Ce^{4+}$), a praseodymium ion ($Pr^{4+}$), or a terbium ion ($Tb^{4+}$).

For the sake of a high photoelectric conversion efficiency, it is desirable that the electron transport layer 3 have a thickness of greater than or equal to 2 nanometers. When the thickness is greater than or equal to 2 nanometers, since the hole density is suppressed from increasing due to a quantum effect, a hole blocking function is not lost, and the photoelectric conversion efficiency is improved.

To improve the photoelectric conversion efficiency of the solar cell from the viewpoint of low resistance of the electron transport layer 3, it is desirable that the electron transport layer 3 have a thickness of less than or equal to 500 nanometers.

The electron density of the electron transport layer 3 containing the metal oxynitride may be greater than or equal to $10^{16}$ cm$^{-3}$ and less than or equal to $10^{20}$ cm$^{-3}$. The electron density of the electron transport layer 3 being less than or equal to $10^{20}$ cm$^{-3}$ suppresses interfacial recombination between excess electrons in the electron transport layer 3 and the holes in the photoelectric conversion layer from occurring. Therefore, the photoelectric conversion efficiency is improved. In addition, since the electron density of the electron transport layer 3 being greater than or equal to $10^{16}$ cm$^{-3}$ improves the electron transportability of the electron transport layer 3, the photoelectric conversion efficiency is improved.

When the electron transport layer 3 contains a niobium oxynitride, in the niobium oxynitride contained in the electron transport layer 3, a ratio N/O of the amount of substance of N to the amount of substance of O may be greater than 0 and less than or equal to 1 or may be greater than or equal to 0.05 and less than or equal to 0.28. The value of the ratio N/O may be measured using the X-ray photoelectric spectroscopy (hereafter referred to as "XPS method"), the energy dispersive X-ray spectroscopy (hereafter referred to as "EDX method"), the inductively coupled plasma emission spectroscopy (hereafter referred to as "ICP-OES method"), or the Rutherford backscattering spectroscopy (hereafter referred to as "RBS method").

When the electron transport layer 3 contains a tin oxynitride, in the tin oxynitride contained in the electron transport layer 3, a ratio N/O of the amount of substance of N to the amount of substance of O may be greater than 0 and less than or equal to 0.66 or may be greater than or equal to 0.05 and less than or equal to 0.15. The value of the ratio N/O may be measured using the XPS method, the EDX method, the ICP-OES method, or the RBS method.

The electron transport layer 3 may mainly contain a metal oxynitride having electron conductivity. The electron transport layer 3 may consist essentially of a metal oxynitride having electron conductivity. The electron transport layer 3 may be composed of just a metal oxynitride having electron conductivity.

The sentence "the electron transport layer 3 mainly contains a metal oxynitride having electron conductivity" means that the electron transport layer 3 contains greater than or equal to 50% by mole (desirably greater than or equal to 60% by mole) of a metal oxynitride having electron conductivity.

The sentence "the electron transport layer 3 consists essentially of a metal oxynitride having electron conductivity" means that the electron transport layer 3 contains greater than or equal to 90% by mole (desirably greater than or equal to 95% by mole) of a metal oxynitride having electron conductivity.

The electron transport layer 3 may contain, as an electron transport material, a compound other than the metal oxynitride. The electron transport material other than the metal oxynitride may be a material known as the electron transport material of the solar cell. Hereafter, for the sake of distinction, a metal oxynitride is referred to as a first electron transport material and an electron transport material other than the metal oxynitride is referred to as a second electron transport material.

The second electron transport material will be described below.

The second electron transport material may be a semiconductor having a band gap of greater than or equal to 3.0 eV. When the electron transport layer 3 contains a semiconductor having a band gap of greater than or equal to 3.0 eV, visible light and infrared light pass through the electron transport layer 3 and reach the photoelectric conversion layer 4. An example of the semiconductor having a band gap of greater than or equal to 3.0 eV is an organic or inorganic n-type semiconductor.

An example of the organic n-type semiconductor is an imide compound, a quinone compound, a fullerene, or a derivative of the fullerene.

Examples of the inorganic n-type semiconductor include metal oxides, metal nitrides, and perovskite oxides.

An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable.

An example of the metal nitride is GaN.

An example of the perovskite type oxide is $SrTiO_3$ or $CaTiO_3$.

The electron transport layer 3 may be in contact with the photoelectric conversion layer 4. Alternatively, the electron transport layer 3 is not limited to being in contact with the photoelectric conversion layer 4. When the electron transport layer 3 is in contact with the photoelectric conversion layer 4, the electron transport material containing the oxynitride may be disposed on the surface of the electron transport layer 3 in contact with the photoelectric conversion layer 4.

The electron transport layer 3 may be composed of a plurality of layers formed of electron transport materials which differ from each other. When the electron transport layer 3 is composed of a plurality of layers, a layer in contact with the photoelectric conversion layer 4 may contain the metal oxynitride having electron conductivity.

As illustrated in FIG. 2, in a solar cell 100, a first electrode 2, an electron transport layer 3, a photoelectric conversion layer 4, a hole transport layer 5, and a second electrode 6 are stacked in this order on a substrate 1. That is, the hole transport layer 5 is disposed between the second electrode 6 and the photoelectric conversion layer 4. The solar cell 100 is not limited to including the substrate 1. The solar cell 100 is not limited to including the hole transport layer 5.

Each component of the solar cell 100 will be specifically described below.

Substrate 1

The substrate 1 supports the first electrode 2, the photoelectric conversion layer 4, and the second electrode 6. The substrate 1 may be formed of a transparent material. An example of the substrate 1 is a glass substrate or a plastic substrate. An example of the plastic substrate is a plastic film. When the first electrode 2 has sufficient strength, since the first electrode 2 supports the photoelectric conversion layer 4 and the second electrode 6, the solar cell 100 is not limited to including the substrate 1.

First Electrode 2 and Second Electrode 6

The first electrode 2 and the second electrode 6 have electrical conductivity. At least one of the first electrode 2 or the second electrode 6 has a light-transmitting property. The light in the visible region to the near-infrared region can pass through the electrode having a light-transmitting property. The electrode having a light-transmitting property may be formed of a material that is transparent and that has electrical conductivity.

An example of such a material is
  (i) a titanium oxide doped with at least one selected from the group consisting of lithium, magnesium, niobium, and fluorine
  (ii) a gallium oxide doped with at least one selected from the group consisting of tin and silicon
  (iii) a gallium nitride doped with at least one selected from the group consisting of silicon and oxygen
  (iv) an indium-tin complex oxide
  (v) a tin oxide doped with at least one selected from the group consisting of antimony and fluorine
  (vi) a zinc oxide doped with at least one selected from the group consisting of boron, aluminum, gallium, and indium, or
  (vii) a complex of these.

An electrode having a light-transmitting property can be formed by using an opaque material and by being provided with a pattern through which the light passes. An example of the pattern through which the light passes is a linear pattern, a wavy-line-like pattern, a grid-like pattern, or a punching-metal-like pattern in which a plurality of fine through holes are regularly or irregularly arranged. The electrode having a light-transmitting property being provided with these patterns enables the light to pass through portions with no electrode material. An example of the opaque material is platinum, gold, silver, copper, aluminum, rhodium, indium, titanium, iron, nickel, tin, zinc, or an alloy containing any one of these. A carbon material having electrical conductivity may be used as the opaque material.

Since the solar cell 100 includes the electron transport layer 3 between the photoelectric conversion layer 4 and the first electrode 2, the first electrode 2 is not limited to having a blocking property against holes from the photoelectric conversion layer 4. Therefore, the material for forming the first electrode 2 may be a material capable of coming into ohmic contact with the photoelectric conversion layer 4.

When the solar cell 100 does not include the hole transport layer 5, the second electrode 6 is formed from a material having, for example, a blocking property against electrons from the photoelectric conversion layer 4. In such an instance, the second electrode 6 does not come into ohmic contact with the photoelectric conversion layer 4. The blocking property against electrons from the photoelectric conversion layer 4 denotes a property of allowing only holes generated in the photoelectric conversion layer 4 to pass through and not allowing electrons to pass through. The Fermi energy of the material having a blocking property against electrons is lower than the Fermi energy of the energy level of conduction band lower end of the photoelectric conversion layer 4. The Fermi energy of the material having a blocking property against electrons may be lower than the Fermi energy of the photoelectric conversion layer 4. An example of the material having a blocking property against electrons is platinum, gold, or a carbon material such as graphene.

When the solar cell 100 includes the hole transport layer 5 between the photoelectric conversion layer 4 and the second electrode 6, the second electrode 6 is not limited to having a blocking property against electrons from the photoelectric conversion layer 4. In such an instance, the second electrode 6 may be in ohmic contact with the photoelectric conversion layer 4.

A material having a blocking property against holes from the photoelectric conversion layer 4 is not limited to having a light-transmitting property. A material having a blocking property against electrons from the photoelectric conversion layer 4 is not limited to having a light-transmitting property. Therefore, when the first electrode 2 or the second electrode 6 is formed using such materials, the first electrode 2 or the second electrode 6 has the above-described pattern that allows the light to pass through the first electrode 2 or the second electrode 6.

The light transmittance of each of the first electrode 2 and the second electrode 6 may be greater than or equal to 50% or may be greater than or equal to 80%. The wavelength of the light that passes through the electrode is in accordance with the absorption wavelength of the photoelectric conversion layer 4. The thickness of each of the first electrode 2 and the second electrode 6 is within the range of, for example, greater than or equal to 1 nanometer and less than or equal to 1,000 nanometers.

Hole Transport layer 5

The hole transport layer 5 is composed of an organic material or an inorganic semiconductor. A representative example of the organic material used as the hole transport layer 5 is 2,2',7,7'-tetrakis-(N,N-di-p-methoxyphenylamine) 9,9'-spirobifluorene (hereafter referred to as "spiro-OMeTAD"), poly[bis(4-phenyl)(2,4,6-trimethylphenyl) amine] (hereafter referred to as "PTAA"), poly(3-hexylthiophene-2,5-diyl) (hereafter referred to as "P3HT"), poly(3,4-ethylenedioxythiophene) (hereafter referred to as "PEDOT"), or copper phthalocyanine (hereafter referred to as "CuPC").

An example of the inorganic semiconductor is $Cu_2O$, $CuGaO_2$, CuSCN, CuI, $NiO_x$, $MoO_x$, $V_2O_5$, or a carbon material such as a graphene oxide.

The hole transport layer 5 may include a plurality of layers formed of materials which differ from each other.

The thickness of the hole transport layer 5 may be greater than or equal to 1 nanometer and less than or equal to 1,000 nanometers, greater than or equal to 10 nanometers and less than or equal to 500 nanometers, or greater than or equal to 10 nanometers and less than or equal to 50 nanometers. The thickness of the hole transport layer 5 being greater than or equal to 1 nanometer and less than or equal to 1,000 nanometers enables sufficient hole transportability to be realized. Further, when the thickness of the hole transport layer 5 is greater than or equal to 1 nanometer and less than or equal to 1,000 nanometers, the light is converted to electricity with high efficiency since the hole transport layer 5 has low resistance.

The hole transport layer 5 may contain a supporting electrolyte and a solvent. The supporting electrolyte and the solvent stabilize the holes in the hole transport layer 5.

An example of the supporting electrolyte is an ammonium salt or an alkali metal salt. An example of the ammonium salt is tetrabutylammonium perchlorate, tetraethylammonium hexafluorophosphate, an imidazolium salt, or a pyridinium salt. An example of the alkali metal salt is lithium bis (trifluoromethanesulfonyl)imide (hereafter referred to as "LiTFSI"), LiPF6, LiBF4, lithium perchlorate, or potassium tetrafluoroborate.

The solvent contained in the hole transport layer 5 may have high ionic conductivity. The solvent may be an aqueous solvent or an organic solvent. From the viewpoint of stabilization of the solute, an organic solvent is desirable. An example of the organic solvent is a heterocyclic compound such as tert-butylpyridine, pyridine, or n-methylpyrrolidone.

The solvent contained in the hole transport layer 5 may be an ionic liquid. The ionic liquid may be used alone or in combination with other solvents. The ionic liquid is desirable from the viewpoint of low volatility and high flame retardancy.

An example of the ionic liquid is an imidazolium compound such as 1-ethyl-3-methylimidazolium tetracyanoborate, a pyridine compound, an alicyclic amin compound, an aliphatic amin compound, or an azoniumamine compound.

Operation and Advantages of Solar Cell

Next, the basic operation and advantages of the solar cell 100 will be described. When the solar cell 100 is irradiated with light, the photoelectric conversion layer 4 absorbs the light, and excited electrons and holes are generated inside the photoelectric conversion layer 4. The excited electrons move to the electron transport layer 3. On the other hand, the holes generated in the photoelectric conversion layer 4 move to the hole transport layer 5. Since the electron transport layer 3 is coupled to the first electrode 2, and the hole transport layer 5 is coupled to the second electrode 6, a current is output from the first electrode 2 that functions as a negative electrode and the second electrode 6 that functions as a positive electrode.

Method For Producing Solar Cell 100

The solar cell 100 can be produced by, for example, the following method.

Initially, the first electrode 2 is formed on the surface of the substrate 1 by a chemical vapor deposition method (hereafter referred to as "CVD method") or a sputtering method.

Subsequently, the electron transport layer 3 is formed on the first electrode 2 by, for example, a sputtering method.

For example, a metal oxide having electron conductivity is used as the target used in the sputtering method. A film containing the metal oxynitride is formed using a target composed of such a metal oxide in an atmosphere containing a nitrogen gas by the sputtering method. The resulting film containing the metal oxynitride is the electron transport layer 3.

The photoelectric conversion layer 4 is formed on the electron transport layer 3. The photoelectric conversion layer 4 is formed in, for example, the following manner. A method for forming the photoelectric conversion layer 4 containing a perovskite compound denoted by $(HC(NH_2)_2)_{1-y-z}(C_6H_5CH_2CH_2NH_3)_y(CH_6N_3)_zSnI_3$ (herein, $0<y$, $0<z$, and $0<(y+z)<1$, and hereafter referred to as "$FA_{1-y-z}PEA_yGA_zSnI_3$") will be described below as an example.

Initially, a solution mixture is obtained by adding $SnI_2$, $HC(NH_2)_2I$ (hereafter referred to as "FAI"), $C_6H_5CH_2CH_2NH_3I$ (hereafter referred to as "PEAI"), and $CH_6N_3I$ (hereafter referred to as "GAI") to an organic solvent. An example of the organic solvent is a mixture of dimethylsulfoxide (hereafter referred to as "DMSO") and N,N-dimethylformamide (hereafter referred to as "DMF") (DMS:DMF=1:1 (volume ratio)).

The molar concentration of $SnI_2$ may be greater than or equal to 0.8 mol/L and less than or equal to 2.0 mol/L or may be greater than or equal to 0.8 mol/L and less than or equal to 1.5 mol/L.

The molar concentration of FAI may be greater than or equal to 0.8 mol/L and less than or equal to 2.0 mol/L or may be greater than or equal to 0.8 mol/L and less than or equal to 1.5 mol/L.

The molar concentration of PEAI may be greater than or equal to 0.1 mol/L and less than or equal to 0.6 mol/L or may be greater than or equal to 0.3 mol/L and less than or equal to 0.5 mol/L.

The molar concentration of GAI may be greater than or equal to 0.1 mol/L and less than or equal to 0.6 mol/L or may be greater than or equal to 0.3 mol/L and less than or equal to 0.5 mol/L.

Thereafter, the solution mixture is heated to a temperature of higher than or equal to 40° C. and lower than or equal to 180° C. In this manner, a solution mixture in which $SnI_2$, FAI, PEAI, and GAT are dissolved is obtained. Subsequently, the solution mixture is left to stand at room temperature.

Thereafter, the electron transport layer 3 is coated with the solution mixture by a spin coating method so as to form a coating film. Subsequently, the coating film is heated at a temperature of higher than or equal to 40° C. and lower than or equal to 100° C. for a time of greater than or equal to 15 min and less than or equal to 1 hour. Consequently, the photoelectric conversion layer 4 is formed. When the solution mixture is applied by the spin coating method, a poor solvent may be dripped during spin coating. An example of the poor solvent is toluene, chlorobenzene, or diethyl ether.

The solution mixture may contain a quencher substance such as tin fluoride. The concentration of the quencher substance may be greater than or equal to 0.05 mol/L and less than or equal to 0.4 mol/L. The quencher substance suppresses a defect from occurring in the photoelectric conversion layer 4. A cause of a defect occurring in the photoelectric conversion layer 4 is, for example, an increase of Sn vacancies due to an increase of the amount of $Sn^{4+}$.

The hole transport layer 5 is formed on the photoelectric conversion layer 4. An example of the method for forming the hole transport layer 5 is a coating method or a printing method. An example of the coating method is a doctor blade method, a bar coating method, a dip coating method, or a spin coating method. An example of the printing method is a screen printing method. A plurality of materials may be mixed so as to obtain the hole transport layer 5, and the hole transport layer 5 may be pressurized or heat-treated. When the material for forming the hole transport layer 5 is a low-molecular-weight body or an inorganic semiconductor, the hole transport layer 5 may be produced by a vacuum vapor deposition method.

Finally, the second electrode 6 is formed on the hole transport layer 5. In this manner, the solar cell 100 is obtained. The second electrode 6 may be formed by a CVD method or a sputtering method.

Figure 3:
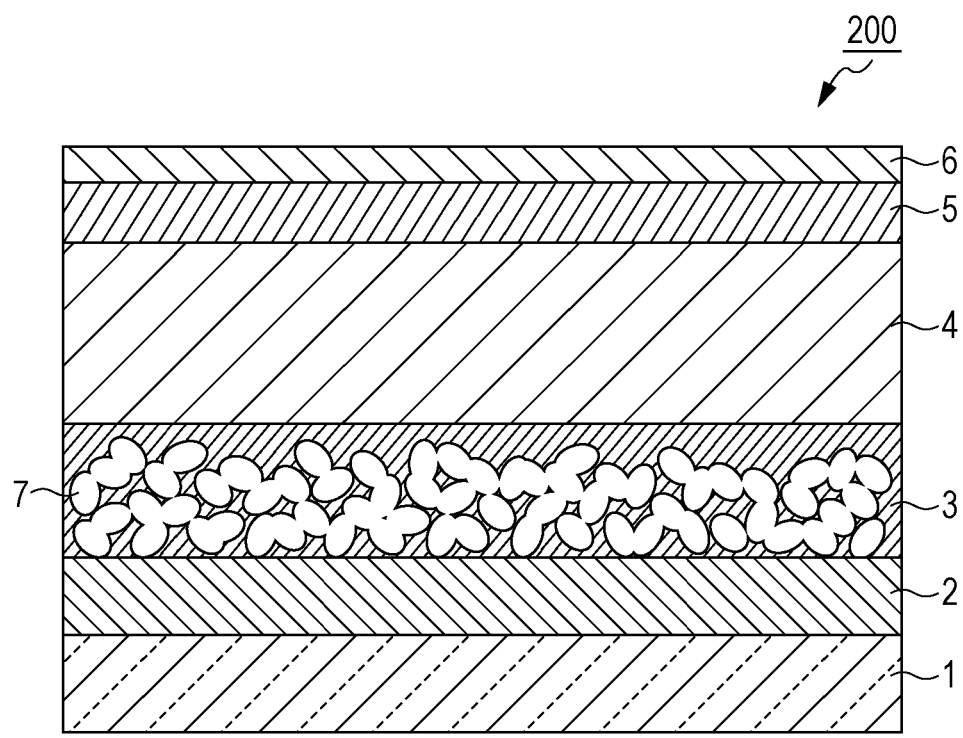
FIG. 3 is a sectional view illustrating a solar cell according to a modified example of an embodiment of the present disclosure.

FIG. 3 is a sectional view illustrating a modified example of a solar cell according to an embodiment. In contrast to the solar cell 100 illustrated in FIG. 2, a solar cell 200 includes a porous layer 7.

In the solar cell 200 illustrated in FIG. 3, the first electrode 2, the porous layer 7, the electron transport layer 3, the photoelectric conversion layer 4, the hole transport layer 5, and the second electrode 6 are stacked in this order on the substrate 1. The porous layer 7 includes a porous body. The porous body includes pores. The solar cell 200 is not limited to including the substrate 1. The solar cell 200 is not limited to including the hole transport layer 5.

Pores included in the porous layer 7 are connected from a portion in contact with the first electrode 2 to a portion in contact with the electron transport layer 3. The pores included in the porous layer 7 are filled with the material for forming the electron transport layer 3. Since the first electrode 2 is in contact with the electron transport layer 3, electrons move directly from the electron transport layer 3 to the first electrode 2.

Next, the basic operation and advantages of the solar cell 200 will be described. When the solar cell 200 is irradiated with light, the photoelectric conversion layer 4 absorbs the light and generates excited electrons and holes. The excited electrons move to the electron transport layer 3. On the other hand, holes generated in the photoelectric conversion layer 4 move to the hole transport layer 5. As described above, since the electron transport layer 3 and the hole transport layer 5 are electrically coupled to the first electrode 2 and the second electrode 6, respectively, a current is output from the first electrode 2 and the second electrode 6 which function as a negative electrode and a positive electrode, respectively.

The porous layer 7 facilitates formation of the photoelectric conversion layer 4. The electron transport layer 3 formed on the porous layer 7 may cover the surface and pore walls of the porous layer 7. Since the thickness of the electron transport layer 3 is small, the shapes of the surface and pores are maintained. In such an instance, the material for forming the photoelectric conversion layer 4 also enters inside pores of the porous layer 7 covered with the electron transport layer 3. Therefore, a possibility of the material for forming the photoelectric conversion layer 4 being repelled by the surface of the electron transport layer 3 or aggregating is reduced. Therefore, the porous layer 7 serves as a foothold of the photoelectric conversion layer 4, and the photoelectric conversion layer 4 can be formed as a uniform film. The photoelectric conversion layer 4 may be formed by the solution being applied to the electron transport layer 3 by a spin coating method and being heated.

The porous layer 7 causes light scattering. Therefore, the optical path length of the light passing through the photoelectric conversion layer 4 can be increased. The optical path length being increased enables the amounts of electrons and holes generated in the photoelectric conversion layer 4 to be increased.

The solar cell 200 can be produced by a method akin to that for the solar cell 100. The porous layer 7 is formed on the first electrode 2 by, for example, a coating method.

Porous Layer 7

The porous layer 7 serves as a foothold for forming the photoelectric conversion layer 4. The porous layer 7 does not hinder electrons from moving from the photoelectric conversion layer 4 to the first electrode 2.

The porous layer 7 includes a porous body. An example of the porous body is a porous body in which insulating or semiconductor particles are connected. An example of the insulating particle is aluminum oxide or silicon oxide. An example of the semiconductor particle is an inorganic semiconductor particle. An example of the inorganic semiconductor is a metal oxide (including a perovskite oxide), a metal sulfide, or a metal chalcogenide. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the perovskite oxide is $SrTiO_3$ or $CaTiO_3$. An example of the metal sulfide is CdS, ZnS, $In_2S_3$, SnS, PbS, $Mo_2S$, $WS_2$, $Sb_2S_3$, $Bi_2S_3$, $ZnCdS_2$, or $Cu_2S$. An example of the metal chalcogenide is CdSe, CsSe, $In_2Se_3$, $WSe_2$, HgS, SnSe, PbSe, or CdTe.

The thickness of the porous layer 7 may be greater than or equal to 0.01 micrometers and less than or equal to 10 micrometers or may be greater than or equal to 0.1 micrometers and less than or equal to 1 micrometer. The surface roughness of the porous layer 7 may be large. Specifically, the surface roughness coefficient given by effective area/projected area may be greater than or equal to 10 or may be greater than or equal to 100. In this regard, the projected area denotes an area of a shadow projected behind an object when the object is irradiated with light from just the front. The effective area denotes the actual surface area of the object. The effective area can be calculated from a volume, which is determined on the basis of the projected area and thickness of the object, and the specific surface area and the bulk density of the material constituting the object. The specific surface area is measured y, for example, a nitrogen adsorption method.

EXAMPLES

The present disclosure will be described below in detail with reference to the examples. As described below, in Example 1 to Example 5 and Comparative example 1 to Comparative example 4, solar cells including an electron transport layer and a photoelectric conversion layer containing a perovskite compound were produced. Further, the characteristic of each solar cell were evaluated. The solar cell according to each of Example 1 to Example 5 and Comparative example 1 to Comparative example 4 was a perovskite solar cell having the structure akin to the structure of the perovskite solar cell 100 illustrated in FIG. 2.

Example 1

A glass substrate (produced by Nippon Sheet Glass Co., Ltd.) including, on the surface, a $SnO_2$ layer doped with indium was prepared. The glass substrate and the $SnO_2$ layer functioned as the substrate 1 and the first electrode 2, respectively. The glass substrate had a thickness of 1 millimeter.

A niobium oxide denoted by a chemical formula $Nb_2O_5$ (produced by Toshima Manufacturing Co., Ltd.) was used as a target. A film was formed on the $SnO_2$ layer of the above-described glass substrate at room temperature by a sputtering method. A nitrogen gas (flow rate: 1 sccm), an oxygen gas (flow rate: 0.1 sccm), and an argon gas (flow rate: 10 sccm) were supplied to a chamber. The pressure in the chamber during sputtering was 0.5 Pa. The RF electric power supplied to the target was 100 W. The treatment according to the sputtering method was applied to the target for 1.5 minutes under the above-described conditions. In this manner, the electron transport layer 3 composed of a niobium oxynitride film was formed. The electron transport layer 3 had a thickness of 8 nanometers. In this manner, an evaluation sample was produced. The resulting sample was transported from an air atmosphere to a nitrogen atmosphere.

A coating liquid containing $SnI_2$, $SnF_2$, and FAI (all are produced by Sigma-Aldrich) was prepared. The solvent of the coating liquid was a solvent mixture of DMSO and DMF. The volume ratio of DMSO to DMF in the solvent mixture was 1:1. The concentration of $SnI_2$ in the coating liquid was 1.2 mol/L. The concentration of $SnF_2$ in the coating liquid was 1.2 mol/L. The concentration of FAI in the coating liquid was 1.2 mol/L. Subsequently, the electron transport layer 3 was coated with 80 microliters of coating solution by a spin coating method. In this manner, a coating film was formed. The coating film was formed in the interior of a glove box. The interior of the glove box was filled with $N_2$. The thickness of the coating film was 500 nm. Thereafter, the coating film was heat-treated under the condition of 120° C. and 30 min. In this manner, the photoelectric conversion layer 4 was formed. A hot plate was used for the heat treatment. The resulting photoelectric conversion layer 4 mainly contained tin-based perovskite compound $FASnI_3$.

Subsequently, the photoelectric conversion layer 4 was coated with 80 microliters of toluene solution containing PTAA (produced by Sigma-Aldrich) with a concentration of 10 mg/mL by the spin coating method. In this manner, the hole transport layer 5 was formed. The hole transport layer 5 was formed in the interior of a glove box. The cross section was analyzed using a scanning electron microscope (hereafter also referred to as "SEM", Helios G3 produced by FEI) so as to examine the thickness of the hole transport layer 5.

Finally, a gold film having a thickness of 120 nm was deposited on the hole transport layer 5 through vapor deposition. In this manner, the second electrode 6 was formed. Thereafter, in a nitrogen atmosphere, an ultraviolet-curable resin (Nagase ChemteX Corporation, model: Model XNR5516Z-B1) was attached around a portion provided with the second electrode 6, nitrogen sealing was performed using glass from above, and transportation from a nitrogen atmosphere to an air atmosphere was performed. Subsequently, the ultraviolet-curable resin was cured by being irradiated with ultraviolet rays for 15 min, so as to complete sealing. In this manner, the solar cell of Example 1 was obtained.

Example 2

In Example 2, when the electron transport layer 3 was formed, a nitrogen gas (flow rate: 5 sccm), an oxygen gas (flow rate: 0.1 sccm), and an argon gas (flow rate: 10 sccm) were supplied to a chamber. A solar cell of Example 2 was obtained by a method akin to that for Example 1 except the above.

Example 3

In Example 3, when the electron transport layer 3 was formed, a nitrogen gas (flow rate: 10 sccm), an oxygen gas (flow rate: 0.1 sccm), and an argon gas (flow rate: 5 sccm) were supplied to a chamber. A solar cell of Example 3 was obtained by a method akin to that for Example 1 except the above.

Example 4

In Example 4, when the electron transport layer 3 was formed, a tin oxide denoted by a chemical formula $SnO_2$ (produced by Toshima Manufacturing Co., Ltd.) was used as a target and a nitrogen gas (flow rate: 10 sccm), an oxygen gas (flow rate: 0.1 sccm), and an argon gas (flow rate: 5 sccm) were supplied to a chamber. A solar cell of Example 4 was obtained by a method akin to that for Example 1 except the above.

Example 5

In Example 5, when the electron transport layer 3 was formed, a tin oxide denoted by a chemical formula $SnO_2$ (produced by Toshima Manufacturing Co., Ltd.) was used as a target and a nitrogen gas (flow rate: 10 sccm), an oxygen gas (flow rate: 0.1 sccm), and an argon gas (flow rate: 1 sccm) were supplied to a chamber. A solar cell of Example 5 was obtained by a method akin to that for Example 1 except the above.

Comparative Example 1

In Comparative example 1, when the electron transport layer 3 was formed, a nitrogen gas was not supplied to a chamber. A solar cell of Comparative example 1 was obtained by a method akin to that for Example 1 except the above.

Comparative Example 2

In Comparative example 2, when the electron transport layer 3 was formed, a tin oxide denoted by a chemical formula $SnO_2$ (produced by Toshima Manufacturing Co., Ltd.) was used as a target and a nitrogen gas was not supplied to a chamber. A solar cell of Comparative example 2 was obtained by a method akin to that for Example 1 except the above.

Comparative Example 3

In Comparative example 3, when the electron transport layer 3 was formed, a tantalum oxide denoted by a chemical formula $Ta_2O_5$ (produced by Toshima Manufacturing Co., Ltd.) was used as a target and a nitrogen gas was not supplied to a chamber. A solar cell of Comparative example 3 was obtained by a method akin to that for Example 1 except the above.

Comparative Example 4

In Comparative example 4, when the electron transport layer 3 was formed, a tantalum oxide denoted by a chemical formula $Ta_2O_5$ (produced by Toshima Manufacturing Co., Ltd.) was used as a target and a nitrogen gas (flow rate: 5 sccm), an oxygen gas (flow rate: 0.1 sccm), and an argon gas (flow rate: 10 sccm) were supplied to a chamber. A solar cell of Comparative example 4 was obtained by a method akin to that for Example 1 except the above.

Measurement of Composition

Regarding each of the examples and the comparative examples, the composition of the electron transport material contained in the electron transport layer 3 included in the sample was specified using an XPS measuring apparatus (trade name: PHI 5000 VersaProbe produced by ULVAC-PHI, Inc.). The AlKα ray was used as the X-ray source. The ratio N/O was determined on the basis of this measurement.

Measurement of Electron Density

Regarding Example 1 to Example 4 and Comparative example 1 to Comparative example 3, the electron density of the electron transport layer 3 included in the sample was calculated from the Fermi energy measured by an XPS method and a transmittance measuring method.

Regarding the electron transport layer 3 included in each sample, the value of energy difference between the valence band upper end and the Fermi energy was obtained using an XPS measuring apparatus (trade name: PHI 5000 VersaProbe produced by ULVAC-PHI, Inc.).

Regarding the electron transport layer 3 included in each sample, the transmittance was measured using a transmittance measuring apparatus (trade name SolidSpec-3700 produced by SHIMADZU CORPORATION). Subsequently, the band gap value of each electron transport layer 3 was obtained from the resulting transmittance.

The energy difference between the conduction band lower end and the Fermi energy of the electron transport layer 3 was calculated on the basis of the thus obtained energy difference between the valence band upper end and the Fermi energy and the band gap value.

The resulting energy difference between the conduction band lower end and the Fermi energy ($E_C$–$E_F$) was substituted into Formula (1) below. As a result, the electron density (n) was determined.

[Math. 1]

$$n = N_C \exp\left(-\frac{E_C - E_F}{kT}\right) \quad (1)$$

In Formula (1) above, $N_C$ represents a state density of the conduction band lower end and was set to be $2.2 \times 10^{18}$ cm$^{-3}$. T represents a temperature and was set to be 300 K. The value of k is the Boltzmann constant.

Calculation of Electrical Conductivity

The value of the electron density (n) determined using Formula (1) above was substituted into Formula (2) below. In this manner, the electrical conductivity σ was determined.

$$\sigma = qn\mu \quad (2)$$

In Formula (2) above, the value of q is an elementary electric charge. The value of μ is carrier mobility. Herein, 0.291 cm$^2$/Vs (that is, the value of the carrier mobility of an oxide film produced by a sputtering method) was used as the value of the carrier mobility μ.

Evaluation of Photoelectric Conversion Efficiency

The solar cell of each of the examples and comparative examples was irradiated with quasi-solar light having illumination intensity of 100 mW/cm$^2$ by using a solar simulator (BPS X300BA: Co., Ltd.) so as to measure the photoelectric conversion efficiency of each solar cell.

Table 1 presents the following of the examples and the comparative examples,
- (i) regarding production of the electron transport layer, the target material used, presence or absence of nitrogen, and the material contained in the resulting electron transport layer
- (ii) the photoelectric conversion material contained in the photoelectric conversion layer
- (iii) the ratio N/O in the electron transport layer
- (iv) the energy difference between the conduction band lower end and the Fermi energy in the electron transport layer
- (v) the electron density in the electron transport layer
- (vi) the electrical conductivity in the electron transport layer, and
- (vii) the photoelectric conversion efficiency of the solar cell.

According to comparisons between Example 1 to Example 3 and Comparative example 1, regarding the electron transport layer containing the niobium oxynitride, the electron density is increased and the photoelectric conversion efficiency is improved compared with the electron transport layer containing the niobium oxide to which nitrogen is not added. In addition, according to comparisons between Example 1 and Example 2, when the ratio N/O is within the range of 0.05 to 0.28, the electron density is increased and the photoelectric conversion efficiency is improved with increasing the nitrogen composition in the electron transport layer. Likewise, according to comparisons between Example 4 and Comparative example 2, regarding the electron transport layer containing the tin oxynitride, the electron density is increased and the photoelectric conversion efficiency is improved compared with the electron transport layer containing the tin oxide to which nitrogen is not added. Therefore, the oxynitride has a higher electron density than the oxide. As a result, the electron transport layer containing the oxynitride can realize a solar cell having an improved photoelectric conversion efficiency.

On the other hand, as is clear from comparisons between Example 1 and Comparative example 4, when the tantalum oxynitride is used as the electron transfer material, the electron conductivity is poor. Therefore, a photoelectric conversion function is hindered, and a function as the solar cell is not realized. This means that when an oxide such as the tantalum oxide of Comparative example 5 which has poor electron conductivity and which does not function as the electron transport layer is used as a sputtering target, the electron conductivity of the oxynitride is poor even when nitrogen is added so as to produce an oxynitride in a manner similar to the oxide, and, therefore, such an oxynitride does not function as the electron transport layer. In this regard, in consideration of the photoelectric conversion efficiency of Comparative example 3 and Comparative example 4, it is conjectured that the electrical conductivity in the electron transport layer of Comparative example 4 is at the same level as the electrical conductivity in the electron transport layer of Comparative example 3. Consequently, use of the oxynitride obtained by adding nitrogen to the oxide such as a niobium oxide and a tin oxide, which have electron transport characteristics, for the electron transport layer enables a solar cell having a high photoelectric conversion efficiency to be realized.

TABLE 1

| | Electron transport layer | | | | Ratio N/O in electron transport layer (molar ratio) | $(E_C - E_F)$ in electron transport layer (eV) | Electron density in electron transport layer $(cm^{-3})$ | Electric conductivity in electron transport layer $(S \cdot cm^{-1})$ | photo-electric conversion efficiency (%) |
| | Target material | | Material contained in electron transport layer | photo-electric conversion material | | | | | |
| | Compound | Presence or absence of electron conductivity | Presence or absence of nitrogen gas | | | | | | | |
|---|---|---|---|---|---|---|---|---|---|---|
| Comparative example 1 | $Nb_2O_5$ | yes | none | niobium oxide | $FASnI_3$ | 0 | 0.24 | $2.1 \times 10^{14}$ | $1.0 \times 10^{-5}$ | 2.39 |
| Example 1 | $Nb_2O_5$ | yes | yes | niobium oxynitride | $FASnI_3$ | 0.132 | −0.07 | $3.2 \times 10^{19}$ | 1.52 | 3.95 |
| Example 2 | $Nb_2O_5$ | yes | yes | niobium oxynitride | $FASnI_3$ | 0.212 | −0.07 | $3.0 \times 10^{19}$ | 1.40 | 3.59 |
| Example 3 | $Nb_2O_5$ | yes | yes | niobium oxynitride | $FASnI_3$ | 0.342 | 0.16 | $4.7 \times 10^{15}$ | $2.0 \times 10^{-4}$ | 2.8 |
| Comparative example 2 | $SnO_2$ | yes | none | tin oxide | $FASnI_3$ | 0 | 0.10 | $4.7 \times 10^{16}$ | $2.0 \times 10^{-3}$ | 1.32 |
| Example 4 | $SnO_2$ | yes | yes | tin oxynitride | $FASnI_3$ | 0.09 | 0.08 | $1.01 \times 10^{17}$ | $4.7 \times 10^{-3}$ | 1.98 |
| Example 5 | $SnO_2$ | yes | yes | tin oxynitride | $FASnI_3$ | 0.20 | — | — | — | 1.66 |
| Comparative example 3 | $Ta_2O_5$ | none | none | tantalum oxide | $FASnI_3$ | 0 | 0.39 | $6.72 \times 10^{11}$ | $3.1 \times 10^{-8}$ | 0.00 |
| Comparative example 4 | $Ta_2O_5$ | none | yes | tantalum oxynitride | $FASnI_3$ | 0.191 | — | — | — | 0.00 |

The solar cell according to the present disclosure is useful as, for example, a solar cell disposed on a roof.

What is claimed is:

1. A solar cell comprising:
    a first electrode;
    a second electrode;
    a photoelectric conversion layer disposed between the first electrode and the second electrode; and
    an electron transport layer disposed between the first electrode and the photoelectric conversion layer,
    wherein at least one electrode selected from the group consisting of the first electrode and the second electrode has a light-transmitting property,
    the photoelectric conversion layer contains a perovskite compound composed of a monovalent cation, a divalent cation, and a halogen anion,
    the electron transport layer contains a metal oxynitride having electron conductivity, and
    the metal oxynitride is a niobium oxynitride and has an electrical conductivity of greater than or equal to $1 \times 10^{-7}$ S/cm, and
    in the niobium oxynitride, a ratio N/O of the amount of substance of N to the amount of substance of O is greater than or equal to 0.05 and less than or equal to 0.28.

2. The solar cell according to claim 1,
    wherein the metal oxynitride is at least one selected from the group consisting of a niobium oxynitride, a tin oxynitride, a titanium oxynitride, a zinc oxynitride, an indium oxynitride, a tungsten oxynitride, an iron oxynitride, a cesium oxynitride, a nitrided strontium titanate, a nitrided zinc tin oxide, and a nitrided barium tin oxide.

3. The solar cell according to claim 2,
    wherein the metal oxynitride is at least one selected from the group consisting of a niobium oxynitride and a tin oxynitride.

4. The solar cell according to claim 1,
    wherein the monovalent cation includes a formamidinium cation.

5. The solar cell according to claim 1,
    wherein the halogen anion include an iodide ion.

6. The solar cell according to claim 1,
    wherein the divalent cation includes at least one selected from the group consisting of a tin ion and a lead ion.

7. The solar cell according to claim 1,
    wherein a hole transport layer is disposed between the second electrode and the photoelectric conversion layer.

* * * * *